US009075111B2

(12) United States Patent
El-Maleh et al.

(10) Patent No.: US 9,075,111 B2
(45) Date of Patent: Jul. 7, 2015

(54) GENERALIZED MODULAR REDUNDANCY FAULT TOLERANCE METHOD FOR COMBINATIONAL CIRCUITS

(71) Applicant: KING FAHD UNIVERSITY OF PETROLEUM AND MINERALS, Dhahran (SA)

(72) Inventors: Aiman Helmi El-Maleh, Dhahran (SA); Feras M. Chikh Oughali, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 66 days.

(21) Appl. No.: 14/047,869

(22) Filed: Oct. 7, 2013

(65) Prior Publication Data

US 2015/0100839 A1 Apr. 9, 2015

(51) Int. Cl.
*G01R 31/28* (2006.01)
*G01R 31/3177* (2006.01)
*G01R 31/3183* (2006.01)

(52) U.S. Cl.
CPC ...... *G01R 31/3177* (2013.01); *G01R 31/31835* (2013.01)

(58) Field of Classification Search
None
See application file for complete search history.

(56) References Cited

U.S. PATENT DOCUMENTS

| | | | | |
|---|---|---|---|---|
| 4,566,105 A | * | 1/1986 | Oisel et al. | 714/756 |
| 4,661,955 A | * | 4/1987 | Arlington et al. | 714/6.1 |
| 5,537,425 A | * | 7/1996 | Tsou | 714/805 |
| 5,867,501 A | * | 2/1999 | Horst et al. | 370/474 |
| 5,931,959 A | * | 8/1999 | Kwiat | 714/48 |
| 6,151,689 A | * | 11/2000 | Garcia et al. | 714/49 |
| 6,731,550 B2 | | 5/2004 | McClure | |
| 7,669,097 B1 | * | 2/2010 | Teig et al. | 714/725 |
| 7,906,984 B1 | | 3/2011 | Montiminy et al. | |
| 8,266,563 B2 | | 9/2012 | Plaza et al. | |
| 8,296,604 B1 | | 10/2012 | Trimberger | |
| 2004/0124876 A1 | * | 7/2004 | Plants | 326/39 |
| 2013/0086444 A1 | | 4/2013 | Liu | |

FOREIGN PATENT DOCUMENTS

WO WO 2013/057707 A1 4/2012

OTHER PUBLICATIONS

Kim et al., "Soft N-Modular Redundancy," 2010 IEEE.

* cited by examiner

*Primary Examiner* — Daniel McMahon
(74) *Attorney, Agent, or Firm* — Richard C Litman

(57) ABSTRACT

A fault tolerance method for combinational circuits is provided. In order to increase reliability of combinational circuits, extra redundant modules are added to the circuit logic. The method further utilizes redundancy techniques to improve soft error reliability, and is based on probability of occurrence for combinations at the outputs of circuits, thus enhancing the reliability of the combinational circuits.

10 Claims, 7 Drawing Sheets

*400*

| S1 | S2 | S3 |
|---|---|---|
| 0 | 0 | 0 |
| 1 | 1 | 1 |

With Single Transient Error
→ 100, 010, 001
→ 011, 101, 110

S2S3 / S1

|  | 00 | 01 | 11 | 10 |
|---|---|---|---|---|
| 0 | 0 | 0 | 1 | 0 |
| 1 | 1 | 1 | 1 | 1 |

| C1 | C2 | S1 | S2 |
|---|---|---|---|
| 0 | 0 | 0 | 0 |
| 0 | 0 | 1 | 1 |
| 1 | 1 | 0 | 0 |
| 1 | 1 | 1 | 1 |

With Single Transient Error
→ 1011, 0111, 0001, 0010
→ 0100, 1000, 1110, 1101

| C1 C2 \ S1S2 | 00 | 01 | 11 | 10 |
|---|---|---|---|---|
| 00 | 0 | 0 | 0 | 0 |
| 01 | 1 | x | 1 | x |
| 11 | 1 | 1 | 1 | 1 |
| 10 | 1 | x | 0 | x |

C = C1C2 + S1'(C1 + C2)

| C1 C2 \ S1S2 | 00 | 01 | 11 | 10 |
|---|---|---|---|---|
| 00 | 0 | 1 | 1 | 1 |
| 01 | 0 | x | 1 | x |
| 11 | 0 | 0 | 1 | 0 |
| 10 | 0 | x | 1 | x |

| C1 | C2 | C3 | S1 | S2 | S3 | With Single Transient Error |
|---|---|---|---|---|---|---|
| 0 | 0 | 0 | 0 | 0 | 0 | 100000, 010000, 001000, 000100, 000010, 000001 |
| 0 | 0 | 0 | 1 | 1 | 1 | 100111, 010111, 001111, 000011, 000101, 000110 |
| 1 | 1 | 1 | 0 | 0 | 0 | 011000, 101000, 110000, 111100, 111010, 111001 |
| 1 | 1 | 1 | 1 | 1 | 1 | 011111, 101111, 110111, 111011, 111101, 111110 |

|   | M1 | R1 | R2 | M2 | R3 | R4 |
|---|----|----|----|----|----|----|
|   | 0  | 0  | 0  | 0  | 0  | 0  |
|   | 0  | 0  | 0  | 1  | 1  | 1  |
|   | 1  | 1  | 1  | 0  | 0  | 0  |
|   | 1  | 1  | 1  | 1  | 1  | 1  |

|   | M1 | M2 | C1 | C2 | C3 |
|---|----|----|----|----|----|
|   | 0  | 0  | 0  | 0  | -  |
|   | 0  | 1  | 1  | 1  | 0  |
|   | 1  | 0  | 1  | 1  | 1  |
|   | 1  | 1  | 0  | -  | -  |

GENERALIZED MODULAR REDUNDANCY FAULT TOLERANCE METHOD FOR COMBINATIONAL CIRCUITS

BACKGROUND OF THE INVENTION

1. Field of the Invention

The present invention relates to fault tolerant nano-circuitry, and particularly to a generalized modular redundancy fault tolerance method for combinational circuits.

2. Description of the Related Art

Nano-scale devices are continuously shrinking, operating at lower voltages and higher frequencies. This makes them more susceptible to environmental perturbations and distinguished by their high dynamic fault rates. The soft error rate (SER) produced by these effects may exceed the failure in time (FIT) specifications in various application domains. In such applications, soft-error mitigation schemes should be employed for both memories and logic. Redundancy techniques are widely used to increase the reliability of combinational logic circuits. All fault tolerance approaches rely on some sort of redundancy. Otherwise, there will be no way to tell that a device has changed its state into an incorrect one. Many researches have investigated increasing the reliability of circuits using various redundancy schemes. Their main concern is to increase reliability while minimizing the inevitable overhead of area, power, or time.

Thus, a generalized modular redundancy fault tolerance method for combinational circuits solving the aforementioned problems is desired.

SUMMARY OF THE INVENTION

The generalized modular redundancy fault tolerance method for combinational circuits utilizes redundancy techniques to improve soft error reliability and is based on probability of occurrence for combinations at the outputs of circuits. The generalized modular redundancy method enhances the reliability of combinational circuits. Types of redundant modules, complexity of voters and single versus multiple outputs protection are explored.

These and other features of the present invention will become readily apparent upon further review of the following specification and drawings.

BRIEF DESCRIPTION OF THE DRAWINGS

FIG. 4 is a block diagram depicting protecting all output combinations in single output circuits and the needed correction logic in a generalized modular redundancy fault tolerance method for combinational circuits according to the present invention.

FIG. 5 is a schematic diagram depicting output combinations of a full adder after output pair protective replication in a generalized modular redundancy fault tolerance method for combinational circuits according to the present invention.

FIG. 6 is a schematic diagram depicting the full adder's protected outputs after replication in a generalized modular redundancy fault tolerance method for combinational circuits according to the present invention.

FIG. 7 is a schematic diagram depicting protecting all output combinations at the full adder's outputs in a generalized modular redundancy fault tolerance method for combinational circuits according to the present invention.

Similar reference characters denote corresponding features consistently throughout the attached drawings.

DETAILED DESCRIPTION OF THE PREFERRED EMBODIMENTS

At the outset, it should be understood by one of ordinary skill in the art that embodiments of the present method can comprise software or firmware code executing on a computer, a microcontroller, a microprocessor, or a DSP processor; state machines implemented in application specific or programmable logic; or numerous other forms without departing from the spirit and scope of the method described herein. The present method can be provided as a computer program, which includes a non-transitory machine-readable medium having stored thereon instructions that can be used to program a computer (or other electronic devices) to perform a process according to the method. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

The generalized modular redundancy fault tolerance method for combinational circuits utilizes redundancy techniques to improve soft error reliability and is based on probability of occurrence for combinations at the outputs of circuits. The generalized modular redundancy method enhances the reliability of combinational circuits. Types of redundant modules, complexity of voters and single versus multiple outputs protection are explored.

Given a combinational logic circuit with multiple inputs, outputs, and a set of output combinations. Each combination at the output of a circuit has a probability of occurrence. Based on these probabilities, reliability of the logic will be enhanced by protecting those combinations with high probability of occurrence. Reductions in area overhead will be achieved by not protecting combinations with low probability of occurrence.

Based on their probability of occurrence, combinations at the primary outputs of a combinational circuit can be classified into two types: dominant combinations with high probability of occurrence, and those combinations with low probability. When the probability of occurrence for a certain combination is greater than a certain threshold, it is considered as a dominant combination. Other combinations are the ones with low probability of occurrence. Therefore, dominant combinations will be considered for reliability enhancement due to their highly skewed susceptibility to soft errors.

Figure 1:
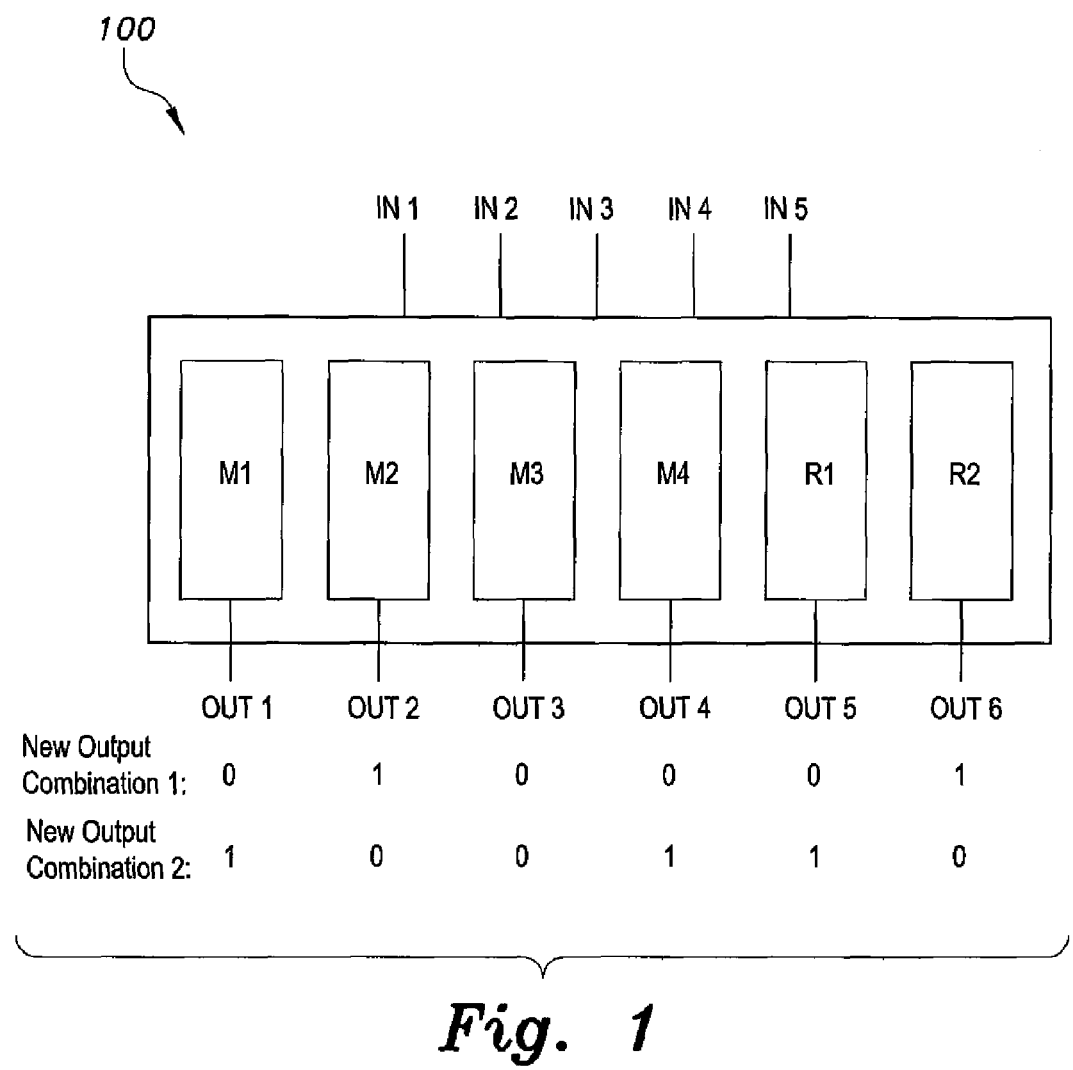
FIG. 1 is a block diagram showing new combinations after introducing redundant modules in a generalized modular redundancy fault tolerance method for combinational circuits according to the present invention.

To increase reliability of circuits, extra redundant modules will be introduced to the logic. New output combinations now consist of original outputs and the outputs of redundant modules formed from a block 100 that includes the original modules M1-M4 and redundant modules R1-R2, as shown in FIG. 1. As faults appear in the logic, faulty combinations might be observed at the outputs. These faulty combinations have to be identified. Then, correct combinations will be recovered from the faulty combinations.

Figure 2:
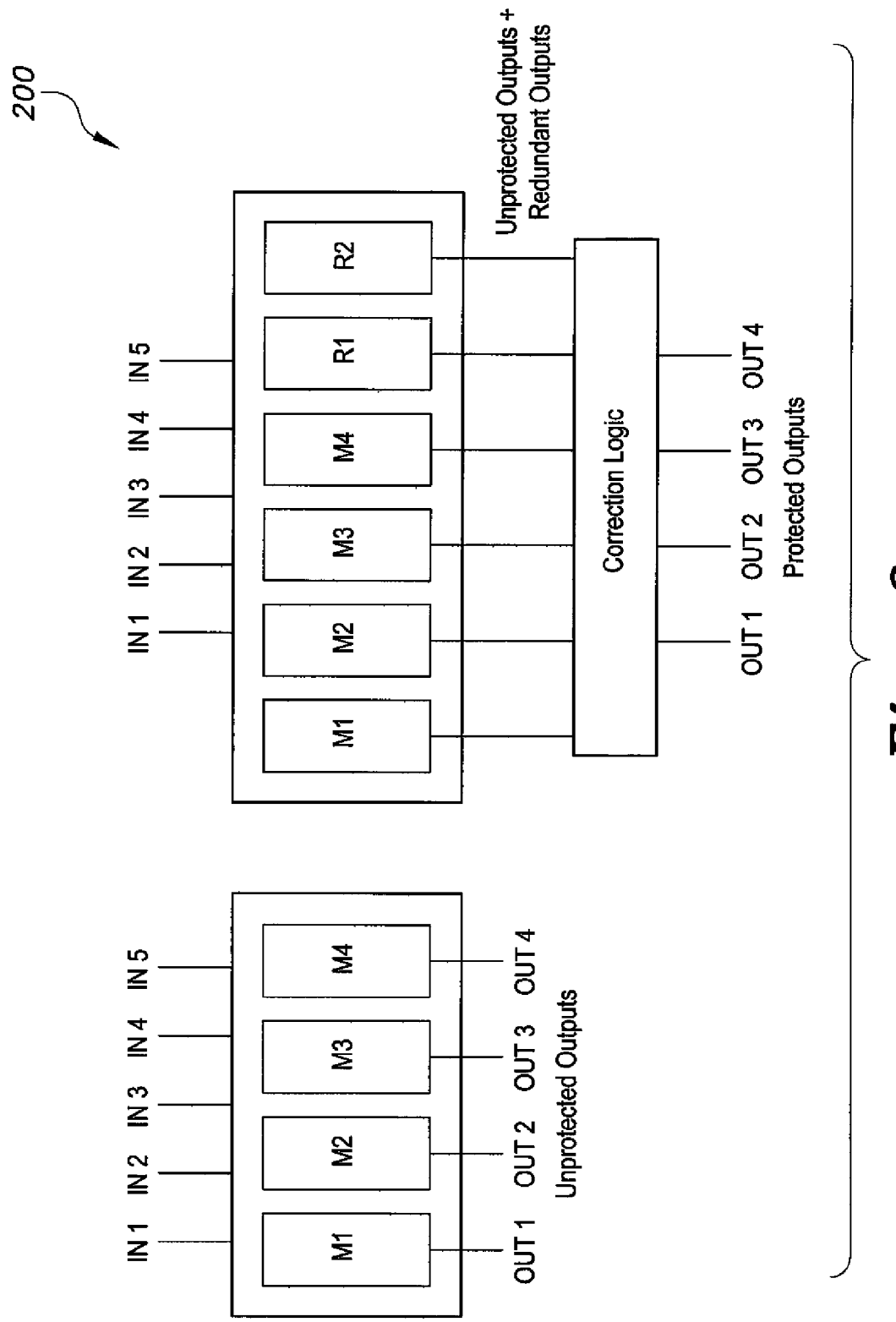
FIG. 2 is a block diagram showing protected outputs after introducing redundant modules in a generalized modular redundancy fault tolerance method for combinational circuits according to the present invention.

To recover from single errors in protected combinations, their faulty combinations have to be individually identified. In information theory, the Hamming distance between two strings of equal length is the number of positions at which the corresponding symbols are different. That is to say, it measures the minimum number of substitutions required to change one string into the other, or the minimum number of errors that could have transformed one string into the other. In the present scenario, by definition, the Hamming distance between a protected combination A, and its faulty combinations is 1. Similarly, the Hamming distance between a protected combination B and any of its faulty combinations is also 1. To insure that no two combinations are identical, the Hamming distance between combinations A and B must be kept to at least 3. For the same reason, Hamming distances between protected and unprotected combinations must be at least 2. Finally, no logic sharing is allowed between different outputs, so that no single error can propagate to more than one output. These Hamming distance requirements have been investigated in previous work for enhancing sequential circuits' reliability. Block 200 includes original modules M1-M4, redundant modules R1-R2 and a correction logic block which applies correction logic to the original outputs plus outputs of redundant modules to produce the protected outputs, as shown in FIG. 2. Redundant modules should be carefully selected in order to meet previously stated Hamming distance requirements.

Consider the case of a single output circuit or one module. Combinations at the output are the simple combination 0 or combination 1. In some cases, the probability of having one combination is far larger than the probability of having the other. So, the dominant combination will be selected for protection, while the other will not. Assume that logic 0 is dominant. New redundant modules have to be introduced to the logic. By replicating the module one time, the Hamming distance requirements are satisfied. After adding the extra module, combination "0" will become "00" and combination "1" will become "11". The first requirement of having a Hamming distance of 3 between protected combinations is already satisfied as there is only one combination to protect. The Hamming distance between the protected combination and the unprotected combination equals to 2. The third requirement is met while synthesizing the circuit by selecting the option of single output optimization to disable logic sharing between different outputs.

Figure 3A:
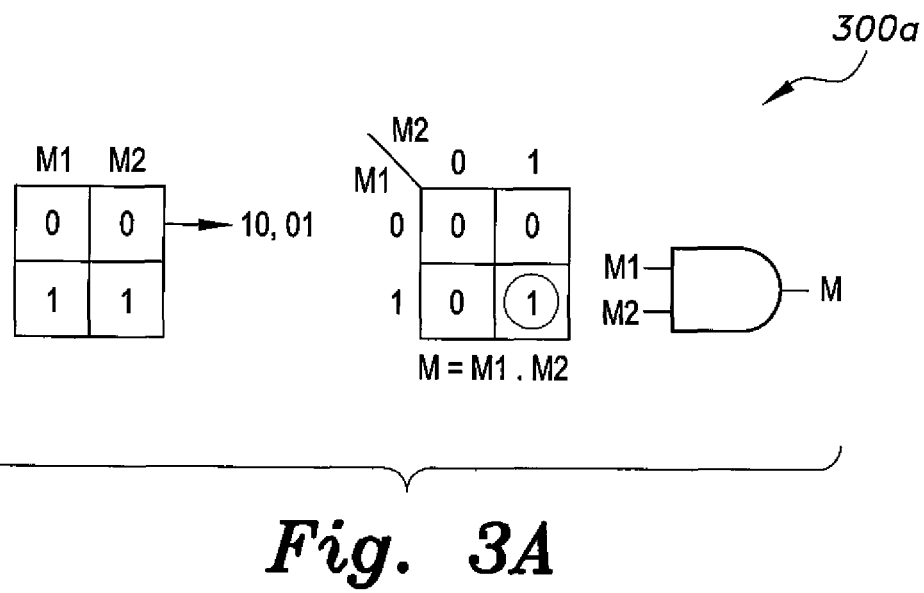
FIG. 3A is a block diagram depicting protecting output value "0" in a single output circuit and the needed correction logic in a generalized modular redundancy fault tolerance method for combinational circuits according to the present invention.
Figure 3B:
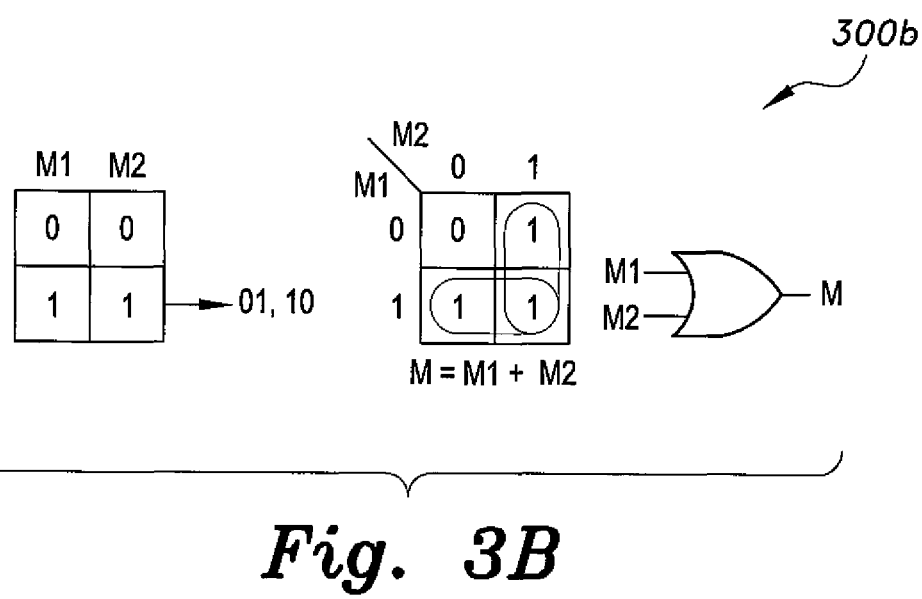
FIG. 3B is a block diagram depicting protecting output value "1" in a single output circuit and the needed correction logic in a generalized modular redundancy fault tolerance method for combinational circuits according to the present invention.

If an error hits and alters the output, while the circuit produces output combination "00", the resulting faulty output combination will be either "01" or "10". In order to obtain the correct output, both original and redundant outputs will be fed to correction logic. In this case, due to dominance of combination 0, it turns out that this correction logic is an AND gate. Correction logic synthesis diagram 300a of FIG. 3A demonstrates these findings. The same observations can be found when the dominant combination is combination "1". However, the correction logic in this case is an OR gate, as demonstrated by correction logic synthesis diagram 300b of FIG. 3B. The use of these dominant combinations along with simple correction logic (AND, OR) has been discussed earlier in the literature, but without this derivation.

When there is no dominant output combination, the two combinations have to be protected. By replicating the module two times, the Hamming distance requirements are satisfied. The Hamming distance between the protected combinations equals to three. There are no unprotected combinations left. To obtain the protected output, all original and redundant outputs will be fed to correction logic. Truth tables 400 of FIG. 4 show the result of replicating the module and the logic needed to obtain the protected output. When protecting all output combinations, the original module is replicated two times. Moreover, the logic that produces the protected output is essentially the 2-out-of-3 majority voter. So, with the purpose of protecting all combinations at the primary output we ended up applying TMR, where we have three exact copies of the original circuit plus a majority voter. When only the dominant combination is protected, area overhead is reduced by a whole module.

The full adder will be used to illustrate the idea of protecting multiple outputs together by using the generalized modular redundancy (GMR) scheme. The full adder consists of two sub-modules: Sum and Carry. Table 1 shows a full adder's truth table. Probability of occurrence for combinations "0" and "1" at the outputs of these modules are all equal to 0.5. Thus, there is no dominant combination in either of the modules. However, by looking at the outputs as a block, it is observed that we have four different output combinations, namely: "00", "01", "10", and "11". It is clearly visible that some combinations are happening more frequently than others, assuming that all input patterns are equally likely to occur. Probability distribution of output combinations at the full adder's outputs is: $P(00)=1/8$, $P(01)=3/8$, $P(10)=3/8$, and $P(11)=1/8$.

TABLE 1

Truth table of a full adder

| Cin | A1 | B1 | Sum | Carry |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Obviously, there is no one dominant combination. However, by protecting more than one combination we can apply GMR scheme. Assume that we want to protect the two combinations with highest probabilities of occurrence ("01" and "10"). Output combination table 500 of FIG. 5 shows that by replicating each module (Sum and Carry) only one time, the Hamming distance requirements are satisfied.

$$H(0011,1100)=4>3 \tag{1}$$

$$H(0000,0011)=2, H(0000,1100)=2$$

$$H(1111,0011)=2, H(1111,1100)=2 \tag{2}$$

Equations 1 and 2 show that the conditions are satisfied where H is the Hamming distance between two combinations. As a result, faulty combinations which will result from a protected combination when a single transient error hits the logic are guaranteed to be disjoint from each other and from other unprotected combinations. The final outputs of the protected version of the full adder can be obtained using the Karnaugh-maps 600, as shown in FIG. 6. It is evident that the area of this logic is comparable to the area of the majority voter. Output combination protection map 700 of FIG. 7 shows that in order to protect all output combinations it is necessary to replicate each module two times. This will ensure that combinations are disjoined. The final protected outputs are also shown in the combination protection map 700. In this case, protecting all combinations, it is necessary to triplicate each module. The correction logic is identical to the majority voters used in TMR. Accordingly, TMR is a special case of GMR that protects all combinations at the output. Area overhead is reduced by two modules as opposed to TMR when the logic is configured to protect the dominant combinations only.

In module replication, a redundant module is essentially a replica of one of the original modules in the circuit. However, newly introduced redundant modules are specially customized modules. In order to protect combinations at the outputs of combinational circuits, some requirements regarding the Hamming distance between combinations have to be met. Having this issue in mind, customized redundant modules, in some cases, are considered more flexible than replicated modules.

Figure 8A:
FIG. 8A is a schematic diagram depicting protecting output combinations 00, 01 and 10 by module replication in a generalized modular redundancy fault tolerance method for combinational circuits according to the present invention.
Figure 8B:
FIG. 8B is a schematic diagram depicting protecting output combinations 00, 01 and 10 by customized redundant modules in a generalized modular redundancy fault tolerance method for combinational circuits according to the present invention.

Consider combinations at the output of a circuit with two outputs. In order to protect combinations "00", "01", and "10" by module replication, each module has to be replicated two times to satisfy the Hamming distance requirements. However, these requirements can be met by adding just three customized modules, resulting in a saving of one module. The maps 800a and 800b of FIGS. 8A and 8B demonstrate the customization of redundant modules, where M1 and M2 are original modules; R1→R4 are replicated modules and C1→C3 are customized redundant modules. Area overhead resulting from adding customized modules is most likely to be less than the overhead introduced by module replication due to existence of don't care conditions.

Nevertheless, adding customized redundant modules requires full description or truth table in order to synthesize these modules properly. Therefore, customized redundant modules are used herein when the truth table has a reasonable size (i.e. number of inputs≤15). Otherwise, module replication is used. However, partial truth tables can be used to synthesize customized redundant modules for circuits with large number of inputs, even though this will not guarantee masking of all faults.

The idea behind GMR is to protect susceptible output combinations against soft errors while saving some area overhead. Two sources of overhead exist in this method: redundant modules and correction logic. Having fewer redundant modules is the key to saving area overhead. However, if the correction logic or voters are complex enough, they will cause to override savings in area overhead. For this reason, correction logic must be minimal in terms of area. We have seen that only one gate (AND or OR) is needed to protect one combination at a single output circuit. A reasonable logic size is needed to protect combinations for circuits with two outputs. Majority voter is used when all combinations at the output are protected. However, experiments show that protecting more than two outputs together demands larger logic to obtain the protected outputs. This may reduce the savings in area achieved by protecting a portion of the combinations at the output. For this reason, the use of GMR in this work is limited to protecting a single or a pair of outputs. In pair protection, the size of the correction logic when protecting two combinations is similar to that of the majority voter; it is smaller when only one combination is protected. However, the size becomes larger when three combinations are protected. This is acceptable, especially when the size of the modules is large enough. The size of the correction logic can be reduced further by using multilevel minimization techniques.

TABLE 2

Benchmark circuits

| Benchmark | Number of inputs | Number of outputs |
|---|---|---|
| 5xp1 | 7 | 10 |
| alu4 | 14 | 8 |
| apex1 | 45 | 43 |
| apex2 | 39 | 3 |
| apex3 | 54 | 50 |
| apex4 | 9 | 19 |
| b12 | 15 | 9 |
| clip | 9 | 5 |
| cordic | 23 | 2 |
| duke2 | 22 | 29 |
| ex5p | 8 | 63 |
| misex2 | 25 | 18 |
| misex3 | 14 | 14 |
| sao2 | 10 | 4 |
| seq | 41 | 35 |
| table3 | 14 | 14 |
| table5 | 17 | 15 |
| vg2 | 25 | 8 |
| z5xp1 | 7 | 10 |

In regard to pair protection, the number of redundant modules is proportional to the number of protected combinations at the outputs. For example, to protect one combination at a two outputs circuit or sub-circuit, one customized redundant module has to be added to the logic. In order to protect two combinations, two customized redundant modules have to be introduced to meet Hamming distance requirements. Protecting three combinations will involve the addition of three customized redundant modules. It is clearly visible that in all these cases area overhead savings will be achieved. Protecting one combination saves three modules and protecting two combinations saves two modules in comparison to TMR. Even when protecting three combinations out of four, we are still able to save a whole module.

The exemplary GMR deals with a single or pair of outputs. Hence, an investigation has to be made in order to verify the effectiveness of each option. To achieve this, a test circuit with two outputs has been devised. Two protection procedures are performed. In the first one, single output protection is applied to each output, while in the other the two outputs are protected as a pair. In single output protection we need to add two redundant modules. For pair protection, the present method protects for two combinations as they require the same area overhead, in terms of redundant modules, when applying single output protection. The percentage of protected combinations at the outputs for both cases is set to be nearly the same. Later, correction logic is added to obtain the protected outputs.

Figure 9:
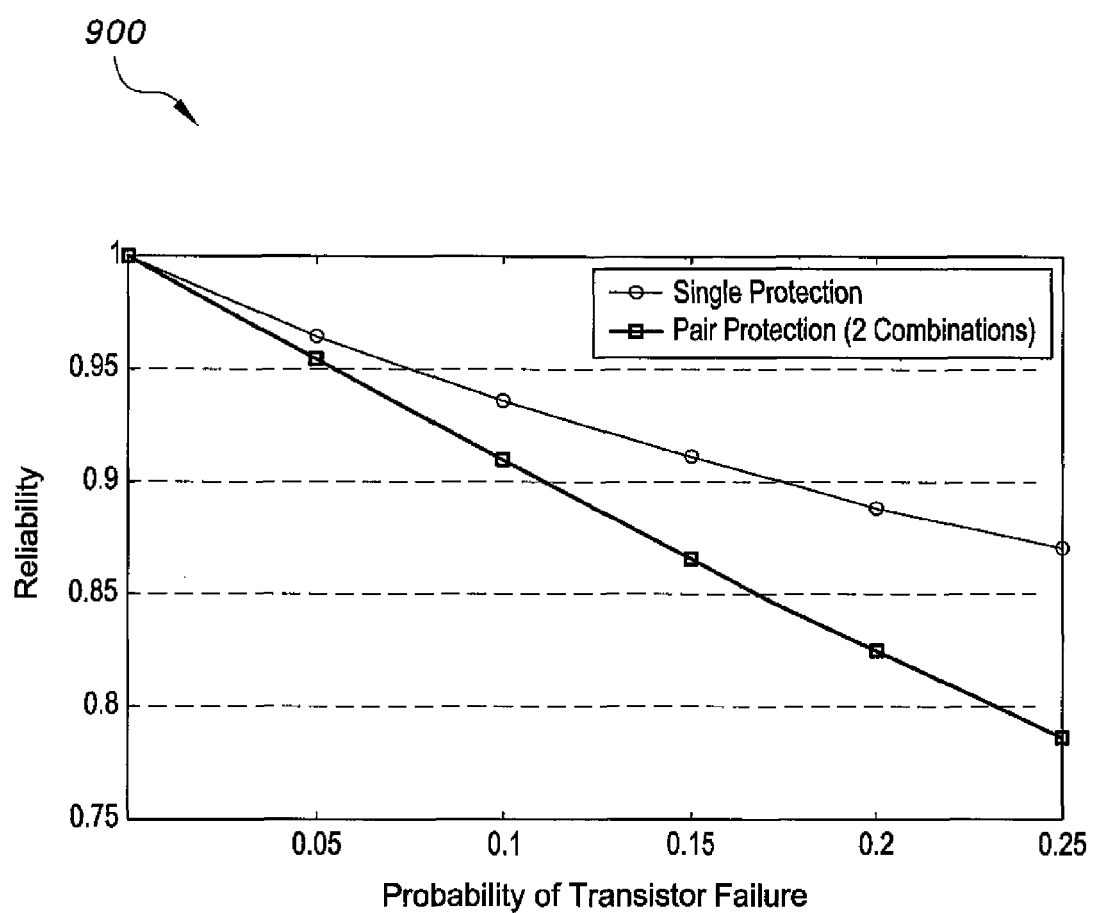
FIG. 9 is a plot showing reliability of single output protection against output pair protection in a generalized modular redundancy fault tolerance method for combinational circuits according to the present invention.

By analyzing the reliability of each method against soft errors, it is evident that single output protection is more advantageous, as shown in reliability plot 900 of FIG. 9. The size of correction logic, which is significantly larger in pair protection, together with probability of masking play an important role in this regards. As this logic has no protection against soft errors, reliability will be degraded as this logic gets bigger. These findings are consistent for larger circuits. Thus, we will favor single output protection whenever it is possible.

By analyzing the reliability of each method against soft errors, it is evident that single output protection is more advantageous, as shown in reliability plot 900 of FIG. 9. The size of correction logic, which is significantly larger in pair protection, together with probability of masking play an important role in this regards. As this logic has no protection against soft errors, reliability will be degraded as this logic gets bigger. These findings are consistent for larger circuits. Thus, we will favor single output protection whenever it is possible.

From the discussion above, we were able to reach some important conclusions about critical issues for applying the generalized modular redundancy scheme to increase combinational circuits' fault tolerance. These conclusions comprise the following.

Customized redundant modules will be used when the truth table has a reasonable size (i.e., number of inputs≤15) for both single and pair protection. Otherwise, module replication will be used for circuits with more than 15 inputs.

To reduce the complexity of the correction logic needed to obtain protected outputs, applying GMR protection can be limited to sub-circuits with one or two outputs.

Single output protection is favored whenever it is possible. If not, pair protection will be used. Otherwise, triple modular redundancy (TMR) will be applied. The algorithm is detailed in Table 3.

TABLE 3

Methodology of applying GMR for enhancing combinational circuits' reliability

| | |
|---|---|
| thr | Protection threshold for identifying dominant combinations |
| T/PT | Truth table - Partial truth table of the circuit |
| $P_i(S)$ | Probability of occurrence of combination S at output i |
| $P_{ij}(S)$ | Probability of occurrence of combination S when pairing output |
| $P(D_i)$ | Probability of dominant combination at output i |
| $P(D_{ij})$ | Probability of dominant combination(s) when pairing outputs i, |
| $N_{P_{ij}}$ | Number of protected combinations when pairing outputs i, j |

| | |
|---|---|
| | Begin |
| 1 | Initialization |
| 2 | Set protection threshold thr |
| 3 | Provide T/PT |
| 4 | Evaluation: |
| 5 | ForEach output i Do |
| 6 | Evaluate probability of occurrence $P_i(0)$, $P_i(1)$ |
| 7 | For all other outputs j |
| 8 | Evaluate probability of occurrence $P_{ij}(00), P_{ij}(01), P_{ij}(10), P_{ij}(11)$ |
| 9 | Choose best candidate j where thr has been met with minimum $N_{P_{ij}}$ |
| 10 | Decision: |
| 11 | If $P(D_i)$ > thrThen |
| 12 | If $N_{P_{ij}}$ > 2 Then |
| 13 | Apply single protection |
| 14 | Else |
| 15 | If $P(D_i) \geq P(D_{ij})$ Then |
| 16 | Apply single protection |
| 17 | Else |
| 18 | Apply pair protection |
| 19 | EndIf |
| 20 | EndIf |
| 21 | Else If $N_{P_{ij}} \leq 3$ Then |
| 22 | Apply pair protection |
| 23 | Else |
| 24 | Apply TMR protection |
| 25 | EndIf |

TABLE 3-continued

Methodology of applying GMR for enhancing combinational circuits' reliability

| | |
|---|---|
| 26 | EndFor |
| | End |

Based on these conclusions, the methodology depicted in Table 3 will be used to apply GMR for enhancing combinational circuits' reliability. In the initialization step, a protection threshold for identifying dominant combinations at the outputs, thr, has to be specified. For a single output, a combination will be considered dominant if the probability of occurrence for this combination is greater than the threshold. However, for pair protection, meeting this threshold might require protecting more than one combination. Combinations with the highest probabilities of occurrence will be protected such that the sum of their probabilities must exceed protection threshold. A truth table of the circuit has to be provided also. This table will be used to calculate probability of occurrence for combinations at the outputs. For circuits with large number of inputs, the table will be unacceptably large. Thus, partial truth tables can be used to estimate probabilities of combinations at the outputs by simulation.

During evaluation, the probability of occurrence for the dominant combination $P(D_i)$ at output i is calculated. Then, output i is paired with other available outputs j and the probability of occurrence for the dominant combination(s) $P(D_{ij})$ is calculated. As we may protect more than one combination, we keep track of the number of protected combinations $NP_{ij}$ when pairing output i with output j. After that, we choose the best candidate j for pairing with i such that $P(D_{ij})$ is greater than thr with minimum value for $NP_{ij}$.

Next, a decision on the protection scheme has to be made. This includes single protection, pair protection and TMR. The cost of applying single output protection for two outputs equals the cost of applying output pair protection when the number of protected combinations $NP_{ij}$ is two. For this reason, the scheme which provides maximum protection will be used, as shown in line 15 of Table 3. If both single protection and output pair protection are not applicable, then TMR will be used to protect the output.

In this work, LGSynth91 benchmarks circuits are used. These contain a set of circuits with various sizes, in terms of size of the logic, and number of inputs and outputs, as detailed in Table 2, supra.

Stuck-open and stuck-short fault models at the transistor level are assumed. Faults can be injected at any transistor; stuck-open means that the transistor is stuck at the OFF state, while stuck-short means that it is stuck at the ON state. The transistor level is used as soft errors usually alter the state of individual transistors. In each simulation iteration, a single or multiple faults are injected randomly, stuck-open or stuck-short is randomly applied to these faulty transistors.

For evaluating circuit failure probability and reliability, a known simulation based reliability model is adopted. Circuit reliability is compared based on the GMR scheme with TMR. To compute the circuit failure probability, $F_m$, resulting from injecting m defective transistors, the following procedure detailed in Table 4 is used.

TABLE 4

Circuit failure probability computation procedure

1. Set the number of iterations to be performed, I, to 10000 and the number of failed simulations, K, to 0.
2. Simulate the fault-free circuit by applying a random test vector T.
3. Randomly inject m transistor defects.
4. Simulate the faulty circuit by applying the test vector T.
5. If the outputs of the fault-free and faulty circuits are different, increment K by 1.
6. Decrement I by 1 and if I is not 0 goto step 2.
7. Failure Rate $F_m = K/10000$.

Assuming that every transistor has the same defect probability, P, and that defects are randomly and independently distributed, the probability of having a number of m defective transistors in a circuit with N transistors follows the binomial distribution as shown in Eq. 3.

$$P(m) = \binom{N}{m} P^m \times (1-P)^{N-m} \quad (3)$$

Assuming the number of transistor defects, m, as a random variable and using the circuit failure probability $F_m$ as a failure distribution in m, the probability of circuit failure, F, and circuit reliability, R, are computed as in Eq. 4 and Eq. 5.

$$F = \Sigma_{m=1}^{N} F_m \times P(m) \quad (4)$$

$$R = 1 - F = 1 - \Sigma_{m=1}^{N} F_m \times P(m). \quad (5)$$

Reliability estimation of combinational circuits can be achieved by measuring their failure rates. Failure rate is the percentage of which a circuit will produce faulty output when a fault is injected in the logic. This way, reliability of a circuit is reciprocally proportional to its failure rate.

In order to investigate the applicability of the present method, it will be applied on the set of benchmarks presented herein. Different values of protection threshold thr are examined. Then, for each value, we evaluate the number of protected modules in the following categories: GMR single output-protection (S), output pair protection (P) and triple modular redundancy (T). For example, benchmark "apex 1" has 11 outputs protected using GMR single output protection, 26 outputs protected using GMR output pair protection, and 6 outputs protected using TMR. Table 5 summarizes this evaluation. As the value of thr drops below one, the number of modules protected by TMR will also decrease. These modules will be protected by GMR as singles or pairs. This is clearly visible in "apex4" benchmark where the number of modules protected by TMR has dropped from 10 to 1.

In most of the cases, the number of modules which are protected by TMR is considerably low. In fact, a good number of cases like: "misex2", "misex3", "table3", "table5", "duke2" and "ex5p" have almost no modules protected as TMR. This enables us to exploit the advantage of GMR where decent reliability figures are achieved while saving area overhead. For few benchmarks like "clip" and "5xp1" TMR is used despite the reduction of thr down to 0.75. For such cases, no or limited area savings can be achieved.

TABLE 5

Analysis of output protection as single output (S), pair of outputs (P), TMR (T) at different protection thresholds

| Bench-mark | # of outputs | thr = 0.95 | | | thr = 0.90 | | | thr = 0.85 | | | thr = 0.75 | | |
|---|---|---|---|---|---|---|---|---|---|---|---|---|---|
| | | S | P | T | S | P | T | S | P | T | S | P | T |
| 5xp1 | 10 | 0 | 2 | 8 | 0 | 2 | 8 | 0 | 2 | 8 | 0 | 4 | 6 |
| alu4 | 8 | 0 | 4 | 4 | 0 | 4 | 4 | 0 | 4 | 4 | 0 | 8 | 0 |
| apex1 | 43 | 11 | 26 | 6 | 11 | 28 | 4 | 13 | 28 | 2 | 31 | 12 | 0 |
| apex2 | 3 | 2 | 0 | 1 | 2 | 0 | 1 | 2 | 0 | 1 | 3 | 0 | 0 |
| apex3 | 50 | 30 | 20 | 0 | 34 | 16 | 0 | 34 | 16 | 0 | 38 | 12 | 0 |
| apex4 | 19 | 1 | 8 | 10 | 1 | 16 | 2 | 2 | 16 | 1 | 2 | 16 | 1 |
| b12 | 9 | 0 | 8 | 1 | 0 | 8 | 1 | 0 | 8 | 1 | 3 | 6 | 0 |
| clip | 5 | 0 | 0 | 5 | 0 | 0 | 5 | 0 | 0 | 5 | 0 | 4 | 1 |
| cordic | 2 | 0 | 2 | 0 | 0 | 2 | 0 | 0 | 2 | 0 | 2 | 0 | 0 |
| duke2 | 29 | 12 | 16 | 1 | 21 | 8 | 0 | 23 | 6 | 0 | 25 | 4 | 0 |
| ex5p | 63 | 26 | 36 | 1 | 36 | 26 | 1 | 51 | 12 | 0 | 63 | 0 | 0 |
| misex2 | 18 | 10 | 8 | 0 | 13 | 4 | 1 | 13 | 4 | 1 | 15 | 2 | 1 |
| misex3 | 14 | 0 | 14 | 0 | 13 | 0 | 1 | 13 | 0 | 1 | 13 | 0 | 1 |
| sao2 | 4 | 2 | 2 | 0 | 2 | 2 | 0 | 2 | 2 | 0 | 2 | 2 | 0 |
| seq | 35 | 11 | 22 | 2 | 13 | 20 | 2 | 13 | 20 | 2 | 13 | 20 | 2 |
| table3 | 14 | 1 | 12 | 1 | 10 | 4 | 0 | 14 | 0 | 0 | 14 | 0 | 0 |
| table5 | 15 | 2 | 12 | 1 | 11 | 4 | 0 | 13 | 2 | 0 | 15 | 0 | 0 |
| vg2 | 8 | 4 | 0 | 4 | 4 | 0 | 4 | 4 | 0 | 4 | 4 | 2 | 2 |
| z5xp1 | 10 | 0 | 2 | 8 | 0 | 2 | 8 | 0 | 2 | 8 | 1 | 2 | 7 |

From this analysis, it can be seen that the present methodology of applying GMR to increase fault tolerance of combinational circuits is very encouraging. With respect to reliability results of applying GMR protection, with thr equals to 0.9, to the set of benchmarks used, the results are compared with the reliability of applying TMR protection. Table 6 reports the reliability results obtained based on the simulation procedure outlined earlier for the generalized modular redundancy scheme for several transistor defect probabilities based on stuck-open and stuck-short defects. Table 7 reports the reliability results for the triple modular redundancy scheme. The effectiveness of the generalized modular redundancy scheme is clearly demonstrated by the results as it achieves higher circuit reliability when compared to that of triple modular redundancy. In addition, GMR scheme requires less area overhead as indicated in the tables.

TABLE 6

Reliability and area overhead of benchmarks for the GMR scheme with 0.9 protection

| Benchmarks | # Trans. | Generalized Modular Redundancy | | | | | | Overhead |
|---|---|---|---|---|---|---|---|---|
| | | 0.0001 | 0.0002 | 0.0005 | 0.001 | 0.002 | 0.005 | |
| alu4 | 17538 | 0.999 | 0.992 | 0.957 | 0.866 | 0.659 | 0.230 | 243.85% |
| apex1 | 38852 | 0.991 | 0.968 | 0.871 | 0.704 | 0.356 | 0.030 | 287.62% |
| apex2 | 23590 | 0.992 | 0.968 | 0.761 | 0.426 | 0.141 | 0.015 | 245.22% |
| apex3 | 25878 | 0.992 | 0.974 | 0.909 | 0.757 | 0.464 | 0.046 | 278.08% |
| apex4 | 34630 | 0.988 | 0.973 | 0.913 | 0.779 | 0.447 | 0.020 | 259.67% |
| b12 | 1818 | 0.999 | 0.997 | 0.993 | 0.984 | 0.960 | 0.866 | 394.35% |
| cordic | 14204 | 0.987 | 0.955 | 0.809 | 0.541 | 0.199 | 0.013 | 200.17% |
| duke2 | 8410 | 0.997 | 0.993 | 0.981 | 0.958 | 0.898 | 0.688 | 240.29% |

TABLE 6-continued

Reliability and area overhead of benchmarks for the GMR scheme with 0.9 protection Generalized Modular Redundancy

| Benchmarks | # Trans. | 0.0001 | 0.0002 | 0.0005 | 0.001 | 0.002 | 0.005 | Overhead |
|---|---|---|---|---|---|---|---|---|
| ex5p | 7148 | 0.991 | 0.983 | 0.960 | 0.924 | 0.845 | 0.641 | 262.22% |
| misex2 | 1404 | 0.997 | 0.994 | 0.986 | 0.972 | 0.945 | 0.867 | 244.60% |
| misex3 | 30086 | 0.994 | 0.982 | 0.907 | 0.729 | 0.316 | 0.008 | 208.87% |
| sao2 | 1870 | 0.999 | 0.998 | 0.995 | 0.986 | 0.963 | 0.868 | 201.51% |
| seq | 47000 | 0.991 | 0.974 | 0.882 | 0.646 | 0.282 | 0.018 | 241.05% |
| table3 | 18884 | 0.994 | 0.988 | 0.962 | 0.892 | 0.698 | 0.188 | 207.43% |
| table5 | 20424 | 0.994 | 0.990 | 0.961 | 0.882 | 0.703 | 0.188 | 209.82% |
| vg2 | 3692 | 0.999 | 0.999 | 0.996 | 0.980 | 0.933 | 0.737 | 265.61% |

TABLE 7

Reliability and area overhead of benchmarks for the TMR scheme

Triple Modular Redundancy

| Benchmarks | # of Trans. | 0.0001 | 0.0002 | 0.0005 | 0.001 | 0.002 | 0.005 | Overhead |
|---|---|---|---|---|---|---|---|---|
| alu4 | 21784 | 0.995 | 0.981 | 0.902 | 0.716 | 0.387 | 0.119 | 302.89% |
| apex1 | 41642 | 0.982 | 0.943 | 0.821 | 0.624 | 0.271 | 0.013 | 308.28% |
| apex2 | 28938 | 0.991 | 0.938 | 0.650 | 0.286 | 0.055 | 0.007 | 300.81% |
| apex3 | 29218 | 0.978 | 0.934 | 0.815 | 0.597 | 0.278 | 0.017 | 313.97% |
| apex4 | 40502 | 0.989 | 0.971 | 0.877 | 0.659 | 0.302 | 0.008 | 303.70% |
| b12 | 1614 | 0.997 | 0.995 | 0.986 | 0.971 | 0.939 | 0.832 | 350.87% |
| cordic | 21340 | 0.984 | 0.917 | 0.650 | 0.321 | 0.107 | 0.013 | 300.73% |
| duke2 | 11254 | 0.978 | 0.960 | 0.916 | 0.830 | 0.650 | 0.276 | 321.54% |
| ex5p | 9816 | 0.980 | 0.959 | 0.896 | 0.798 | 0.636 | 0.302 | 360.09% |
| misex2 | 2190 | 0.991 | 0.982 | 0.956 | 0.912 | 0.827 | 0.605 | 381.53% |
| misex3 | 43576 | 0.985 | 0.953 | 0.776 | 0.423 | 0.077 | 0.001 | 302.53% |
| sao2 | 2888 | 0.998 | 0.996 | 0.987 | 0.969 | 0.920 | 0.727 | 311.21% |
| seq | 59404 | 0.980 | 0.953 | 0.766 | 0.454 | 0.095 | 0.000 | 304.67% |
| table3 | 27676 | 0.990 | 0.973 | 0.919 | 0.784 | 0.485 | 0.040 | 304.00% |
| table5 | 29592 | 0.989 | 0.974 | 0.918 | 0.777 | 0.472 | 0.047 | 304.01% |
| vg2 | 4378 | 0.995 | 0.989 | 0.969 | 0.930 | 0.858 | 0.683 | 314.96% |

For benchmarks with minimal savings in area overhead and where the size of modules is considerably small, the addition of correction logic to obtain protected outputs may cancel the savings. Sometimes, the total overhead of using GMR with such benchmarks may exceed the overhead of using TMR especially when pair protection is used which requires larger correction logic. "b12" benchmark is an example of such circuits. From Table 6 and Table 7 we can see that the area overhead when using GMR is greater than the overhead when TMR is used. Despite the increase of area overhead for this circuit, reliability of GMR is still better than that of TMR. This can be attributed to the existence of don't cares in the customized redundant modules. The only weak spot of a protected circuit is the correction logic which is added to obtain the protected outputs. As the size of this vulnerable part increases, reliability will degrade due to errors in this part of the circuit which is not protected. So, it is favorable to have correction logic which is as small as possible; like the correction logic in single output protection which is only one gate.

In order to increase the fault tolerance of the error-prone correction logic different techniques have been proposed. A cascade NMR or TMR scheme is offered using redundant voters to reduce the probability of circuit failure in the voter. The TMR process can be repeated by combining three of the TMR units with another majority voter to form a second-order TMR unit with even higher reliability. Another technique that adds redundancy at the transistor level and provides built-in immunity to stuck-open, stuck-short and bridges defects was proposed in 2009 by present inventor El-Maleh. This technique is based on replacing each transistor by $N^2$-transistor structure ($N \geq 2$) that guarantees defect tolerance of all N−1 defects. It provides significantly less circuit failure probability and higher reliability than other techniques based on gate level (quadded logic) and unit level (TMR).

To investigate the effect of protecting voters on the overall reliability of the circuit, this technique was used. Table 8 shows the advantage of protecting voters in both cases where GMR and TMR were used for a 4-bit general comparator. The benefit of protecting these voters and how they affect the overall reliability of the circuit is clearly noticed. The overall area overhead of applying GMR and protecting voters for a digital comparator equals to the area overhead of applying TMR to that circuit. However, there is a huge improvement in reliability between these two cases. So, by utilizing the savings in area overhead achieved by GMR in protecting the voters, we can make the most of the generalized modular redundancy in terms of both reliability and area overhead.

TABLE 8

Reliability and area overhead of 4-bit general comparator with/without voter protection

| | Reliability | | | |
|---|---|---|---|---|
| Prob. of Transistor Failure | Protect 3 combinations (no voter prot.) | Protect 3 combinations (voter prot.) | TMR (no voter prot.) | TMR (voter prot.) |
| 3.226E−03 | 0.9832 | 0.9951 | 0.96 | 0.9897 |
| 6.452E−03 | 0.9438 | 0.9785 | 0.8939 | 0.956 |
| 1.613E−02 | 0.8037 | 0.8815 | 0.6211 | 0.7837 |
| 3.226E−02 | 0.562 | 0.6753 | 0.2822 | 0.470 |
| 4.839E−02 | 0.3632 | 0.5072 | 0.1172 | 0.2504 |
| 6.452E−02 | 0.2333 | 0.3789 | 0.0493 | 0.1313 |
| Overhead | 222.58% | 316.77% | 317.42% | 367.10% |

It is to be understood that the present invention is not limited to the embodiments described above, but encompasses any and all embodiments within the scope of the following claims.

We claim:

1. A generalized modular redundancy fault tolerance method for a combinational circuit, comprising the steps of:
    setting a protection threshold thr for identifying dominant combinations at the outputs of the combinational circuit, wherein a combination S is dominant if probability of occurrence for the combination S is greater than the threshold thr;
    generating a truth table of the combinational circuit;
    for each output i of the combinational circuit, calculating probability of occurrence $P_i(0)$, $P_i(1)$, based on the truth table;
    for all remaining outputs j calculating probability of occurrence $P_{ij}(00)$, $P_{ij}(01)$, $P_{ij}(10)$, $P_{ij}(11)$ based on the truth table;
    choosing a best candidate j where thr has been met with minimum $N_{P_{ij}}$;
    synthesizing a first single protection correction circuit operable with the combinational circuit when decision criteria $P(D_i)$>thr and $N_{P_{ij}}$>2 are met, wherein $D_i$ represents a dominant combination at the output i;
    synthesizing a second single protection correction circuit operable with the combinational circuit when decision criteria $P(D_i)$>thr and $N_{P_{ij}} \leq 2$ and $P(D_i) \geq P(D_{ij})$ are met, wherein $D_{ij}$ represents dominant combinations when pairing the outputs i,j;
    synthesizing a first pair protection correction circuit operable with the combinational circuit when decision criteria $P(D_i)$>thr and $N_{P_{ij}} \leq 2$ and $P(D_i) < P(D_{ij})$ are met;
    synthesizing a second pair protection correction circuit operable with the combinational circuit when decision criterion $P(D_i)$>thr is not met and when decision criterion $N_{P_{ij}} \leq 3$ is met;
    synthesizing a triple modular redundancy (TMR) protection correction circuit operable with the combinational circuit when decision criteria for single and pair protection have not been met; and
    wherein $P(D_i)$ is the probability of occurrence for the dominant combination at output i, $P(D_{ij})$ is the probability of occurrence for the dominant combinations at paired outputs i,j, $P_i$ is the probability of occurrence of the combination S at output i, $P_{ij}$ is the probability of occurrence of the combination S when pairing outputs i, j, and $N_{P_{ij}}$ is a number of protected combinations when pairing outputs i, j, the first and second single protection correction circuits, the first and second pair protection correction circuits and the TMR protection correction circuit providing fault protected outputs, ensuring minimum Hamming distance of 3 between the protected combinations and minimum Hamming distance of 1 between the protected combinations and their respective faulty combinations.

2. The generalized modular redundancy fault tolerance method for combinational circuits according to claim 1, wherein the step of generating said truth table comprises generating a partial truth table for estimating said probability of occurrence for said combination S when a number of inputs is greater than 15.

3. The generalized modular redundancy fault tolerance method for combinational circuits according to claim 1, wherein said synthesizing steps further comprise the step of selecting an option of single output optimization to disable logic sharing between different outputs of the respective ones of the protection correction circuits.

4. The generalized modular redundancy fault tolerance method for combinational circuits according to claim 1, wherein said synthesizing steps further comprise the step of applying outputs of original portions of said combinational circuit and outputs of redundant portions of said combinational circuit to an input of a correction logic block, said correction logic block providing said fault protected outputs.

5. The generalized modular redundancy fault tolerance method for combinational circuits according to claim 1, wherein said method is applied only to sub-circuits having no more than two outputs.

6. A computer software product, comprising a non-transitory medium readable by a processor, the non-transitory medium having stored thereon a set of instructions for establishing a generalized modular redundancy fault tolerance method for a combinational circuit, the set of instructions including:
    (a) a first sequence of instructions which, when executed by the processor, causes said processor to set a protection threshold thr for identifying dominant combinations at the outputs of the combinational circuit, wherein a combination S is dominant if probability of occurrence for the combination S is greater than the threshold thr;
    (b) a second sequence of instructions which, when executed by the processor, causes said processor to generate a truth table of the combinational circuit;
    (c) a third sequence of instructions which, when executed by the processor, causes said processor to calculate probability of occurrence $P_i(0)$, $P_i(1)$, based on said truth table, said calculation being performed for each output i of the combinational circuit starting from a most significant bit (MSB);
    (d) a fourth sequence of instructions which, when executed by the processor, causes said processor to calculate probability of occurrence $P_{ij}(00)$, $P_{ij}(01)$, $P_{ij}(10)$, $P_{ij}(11)$ based on said truth table, said fourth instruction sequence calculation being performed for all remaining outputs j;
    (e) a fifth sequence of instructions which, when executed by the processor, causes said processor to choose a best candidate j to pair with output i where thr has been met with minimum $N_{P_{ij}}$;
    (f) a sixth sequence of instructions which, when executed by the processor, causes said processor to synthesize a first single protection correction circuit operable with the combinational circuit when decision criteria $P(D_i)$>thr and $N_{P_{ij}}$>2 are met, wherein $D_i$ represents a dominant combination at the output i;

(g) a seventh sequence of instructions which, when executed by the processor, causes said processor to synthesize a second single protection correction circuit operable with the combinational circuit when decision criteria $P(D_i) > \text{thr}$ and $N_{P_{ij}} \leq 2$ and $P(D_i) \geq P(D_{ij})$ are met, wherein $D_{ij}$ represents dominant combinations when pairing the outputs ij;

(h) an eighth sequence of instructions which, when executed by the processor, causes said processor to synthesize a pair protection correction circuit operable with the combinational circuit when decision criteria $P(D_i) > \text{thr}$ and $N_{P_{ij}} \leq 2$ and $P(D_i) < P(D_{ij})$ are met;

(i) a ninth sequence of instructions which, when executed by the processor, causes said processor to synthesize a pair protection correction circuit operable with the combinational circuit when decision criterion $P(D_i) > \text{thr}$ is not met and when decision criterion $N_{P_{ij}} \leq 3$ is met;

(j) a tenth sequence of instructions which, when executed by the processor, causes said processor to synthesize a triple modular redundancy (TMR) protection correction circuit operable with the combinational circuit when decision criteria for single and pair protection have not been met; and wherein $P(D_i)$ is the probability of occurrence for the dominant combination at output i, $P(D_{ij})$ is the probability of occurrence for the dominant combinations at paired outputs ij, $P_i$ is the probability of occurrence of the combination S at output i, $P_{ij}$ is the probability of occurrence of the combination S when pairing outputs i, j, and $N_{P_{ij}}$ is a number of protected combinations when pairing outputs i,j, said first and second single protection correction circuits, said first and second pair protection correction circuits and said TMR protection correction circuit providing fault protected outputs, ensuring minimum Hamming distance of 3 between the protected combinations and minimum Hamming distance of 1 between said protected combinations and their respective faulty combinations.

7. The computer software product according to claim 6, further comprising an eleventh sequence of instructions which, when executed by the processor, causes said processor to generate a partial truth table for estimating said probability of occurrence for said combination S when a number of inputs is greater than 15.

8. The computer software product according to claim 6, further comprising a twelfth sequence of instructions which, when executed by the processor, causes said processor to select an option of single output optimization to disable logic sharing between different outputs of the respective ones of the protection correction circuits.

9. The computer software product according to claim 6, further comprising a thirteenth sequence of instructions which, when executed by the processor, causes said processor to apply outputs of original portions of said combinational circuit and outputs of redundant portions of said combinational circuit to an input of a correction logic block, said correction logic block providing said fault protected outputs.

10. The computer software product according to claim 6, further comprising a fourteenth sequence of instructions which, when executed by the processor, causes said processor to apply said generalized modular redundancy fault tolerance method only to sub-circuits having no more than two outputs.

* * * * *